United States Patent
Hsu (10) Patent No.: US 10,153,032 B1
(45) Date of Patent: Dec. 11, 2018

(54) PUMP SYSTEM OF A DRAM AND METHOD FOR OPERATING THE SAME

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/620,249

(22) Filed: Jun. 12, 2017

(51) Int. Cl.
*G11C 11/406* (2006.01)
*G11C 11/408* (2006.01)
*G11C 5/14* (2006.01)
*G11C 11/4074* (2006.01)
*G11C 8/08* (2006.01)
*H01L 27/02* (2006.01)

(52) U.S. Cl.
CPC ........ *G11C 11/4085* (2013.01); *G11C 5/147* (2013.01); *G11C 5/146* (2013.01); *G11C 8/08* (2013.01); *G11C 11/4074* (2013.01); *H01L 27/0222* (2013.01)

(58) Field of Classification Search
CPC .................................................. G11C 11/406
USPC ........................................................ 365/222
See application file for complete search history.

(56) References Cited

U.S. PATENT DOCUMENTS

| | | | | |
|---|---|---|---|---|
| 5,699,303 A * | 12/1997 | Hamamoto | ............ | G11C 5/146 365/189.09 |
| 5,717,644 A * | 2/1998 | Hadderman | .......... | G11C 11/406 365/222 |
| 9,640,242 B1 * | 5/2017 | Lo | ...................... | G11C 11/40618 |
| 2003/0067824 A1 * | 4/2003 | Janzen | ................. | G11C 7/1066 365/222 |
| 2006/0087890 A1 * | 4/2006 | Jeong | ...................... | G11C 16/30 365/185.28 |
| 2007/0081366 A1 * | 4/2007 | Stahl | ....................... | H02M 3/07 363/59 |
| 2008/0091990 A1 * | 4/2008 | Bruce | .................... | G11C 5/147 714/721 |
| 2008/0151619 A1 * | 6/2008 | Melik-Martirosian | ...................... | G11C 8/10 365/185.3 |

* cited by examiner

*Primary Examiner* — Min Huang
(74) *Attorney, Agent, or Firm* — Muncy, Geissler, Olds & Lowe, P.C.

(57) ABSTRACT

The present disclosure provides a pump system of a DRAM and a method for operating the same. The pump system includes a pump device and a spare pump assembly. The pump device provides a current sufficient to allow a bank of the DRAM to operate at a normal refresh rate without other spare pump devices in response to a normal instruction which indicates that the bank is instructed to operate at the normal refresh rate. The spare pump assembly includes a first spare pump device configured to provide, in combination with the pump device, a current sufficient to allow the bank to operate at a first refresh rate greater than the normal refresh rate in response to a first instruction which indicates that the bank is instructed to operate at the first refresh rate.

20 Claims, 10 Drawing Sheets

PUMP SYSTEM OF A DRAM AND METHOD FOR OPERATING THE SAME

TECHNICAL FIELD

The present disclosure relates to a pump system, and more particularly, to a pump system which provides a current to a bank of a DRAM.

DISCUSSION OF THE BACKGROUND

Voltage regulators (VRs) are generally used in power delivery applications where an input voltage needs to be transformed to an output voltage in ratios that range from smaller than unity to greater than unity.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a pump system of a DRAM. The pump system includes a pump device and a spare pump assembly. The pump device provides a current sufficient to allow a bank of the DRAM to operate at a normal refresh rate without needing other spare pump devices in response to a normal instruction which indicates that the bank is instructed to operate at the normal refresh rate. The spare pump assembly, which would otherwise provide in combination with the pump device, provides a current only when a circuit structure of the DRAM is redesigned by metal option, including a first spare pump device configured to provide, in combination with the pump device, a current sufficient to allow the bank to operate at a first refresh rate greater than the normal refresh rate in response to a first instruction which indicates that the bank is instructed to operate at the first refresh rate.

In some embodiments, the first refresh rate is double the refresh rate of the normal refresh rate In some embodiments, the pump system further includes a controller configured to disable the first spare pump device in response to the normal instruction.

In some embodiments, the controller is further configured to receive an enable signal, and disable the first spare pump device by not passing the enable signal to the first spare pump device In some embodiments, when the controller receives both the enable signal and the normal instruction, the controller disables the first spare pump device.

In some embodiments, the pump system further includes a controller configured to enable the first spare pump device in response to the first instruction In some embodiments, the controller is further configured to receive an enable signal, and enable the first spare pump device by passing the enable signal to the first spare pump device In some embodiments, when the controller receives both the enable signal and the first instruction, the controller enables the first spare pump device In some embodiments, the spare pump assembly further includes a second spare pump device configured to be kept disabled in any refresh rate which the bank is instructed to operate at, wherein both the first spare pump device and the second spare pump device are a spare pump device.

Another aspect of the present disclosure provides a pump system of a DRAM. The pump system includes a pump device, a spare pump assembly independent of the pump device and a controller. The controller is configured to, based on a refresh rate which a bank of the DRAM is instructed to operate at, either enable the spare pump assembly, the enabled spare pump assembly, in combination with the pump device, providing a current sufficient to allow the bank of the DRAM to operate at the refresh rate, or disable the spare pump assembly, the pump device providing the current sufficient to allow the bank of the DRAM to operate at the refresh rate without the disabled spare pump assembly.

In some embodiments, when the refresh rate includes a normal refresh rate, the controller disables the spare pump assembly, and but when the refresh rate includes a first refresh rate greater than the normal refresh rate, the controller enables the spare pump assembly.

In some embodiments, the spare pump assembly includes a first spare pump device and a second spare pump device. When the controller is configured to enable the spare pump assembly, the controller is further configured to, based on the refresh rate which the bank of the DRAM is instructed to operate at, determine the quantity of spare pump device sufficient to allow the bank to operate at the refresh rate and, based on the determined amount of spare pump device, to enable one or more spare pump devices between the first spare pump device and the second spare pump device, and to disable the remaining spare pump devices. The one or more enabled spare pump devices, in combination with the pump devices, provide a current sufficient to allow the bank of the DRAM to operate at the refresh rate.

In some embodiments, when the refresh rate includes a first refresh rate, the controller enables the first spare pump device and disables the second spare pump device, and when the refresh rate includes a second refresh rate, the controller enables the first spare pump device and the second spare pump device.

In some embodiments, the controller is configured to disable the spare pump assembly in response to a normal instruction which indicates that the refresh rate includes a normal refresh rate, wherein the pump device is configured to provide a current sufficient to allow the bank of the DRAM to operate at the normal refresh rate when the spare pump assembly is disabled.

In some embodiments, the controller is further configured to receive an enable signal, but to disable the spare pump assembly by not passing the enable signal to the spare pump assembly In some embodiments, when the controller receives both the enable signal and the normal instruction, the controller disables the spare pump assembly.

In some embodiments, the controller is configured to enable the spare pump assembly in response to a first instruction which indicates that the refresh rate includes a first refresh rate greater than a normal refresh rate, wherein the pump device is configured to provide a current sufficient to allow the bank of the DRAM to operate at the normal refresh rate when the spare pump assembly is disabled In some embodiments, the controller is further configured to receive an enable signal, and enable the spare pump assembly by passing the enable signal to the spare pump assembly.

In some embodiments, when the controller receives both the enable signal and the first instruction, the controller enables the spare pump assembly.

In some embodiments, the spare pump assembly further includes a third spare pump device configured to be kept disabled in any refresh rate which the bank is instructed to operate at, wherein both the first spare pump device and the second spare pump device are a spare pump device.

Another aspect of the present disclosure provides a method of operating a pump system of a DRAM. The method includes either enabling the spare pump assembly, or disabling the spare pump assembly based on a refresh rate which a bank of the DRAM is instructed to operate at; providing a current sufficient to allow the bank of the DRAM to operate at the refresh rate by the enabled spare pump assembly in combination with the pump device; and providing a current sufficient to allow the bank of the DRAM to operate at the refresh rate by the pump device without the disabled spare pump assembly.

In some embodiments, when the spare pump assembly is further enabled, the method further includes determining the quantity of spare pump device sufficient to allow the bank to operate at the refresh rate based on the refresh rate which the bank of the DRAM is instructed to operate at; enabling one or more spare pump devices between the first spare pump device and the second spare pump device based on the determined amount of spare pump device; disabling the remaining spare pump devices based on the determined quantity of spare pump device; and providing a current sufficient to allow the bank of the DRAM to operate at the refresh rate by the one or more enabled spare pump devices in combination with the pump device.

In the present disclosure, with a connection to the controller, the first spare pump device and the second spare pump device are able to function although the first spare pump device and the second spare pump device are a spare pump device which would otherwise be able to perform functions only when the circuit structure of a DRAM including the spare pump device is redesigned. As a result, the DRAM component usage is efficient. Moreover, with the controller, the pump system is able to provide different currents in response to different refresh rates. As a result, DRAM application flexibility is relatively high.

In contrast, in the comparative DRAM, when a current provided only by a pump device of the DRAM without a spare pump assembly of the DRAM is actually sufficient to allow a bank of the DRAM to operate at the normal refresh rate, the circuit structure of the DRAM is confirmed and there is no need to redesign the circuit structure of the DRAM. In that case, the spare pump assembly is arranged but is not utilized. As a result, component usage of the comparative DRAM is not efficient. Moreover, the DRAM is not able to operate at different refresh rates. As a result, DRAM application flexibility is relatively low.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be considered as connected to the Figure's reference numbers which refer to similar elements throughout the description, and:

DETAILED DESCRIPTION

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled with" another element, the initial element may be directly connected to, or coupled to, another element, or to other intervening elements.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 1:
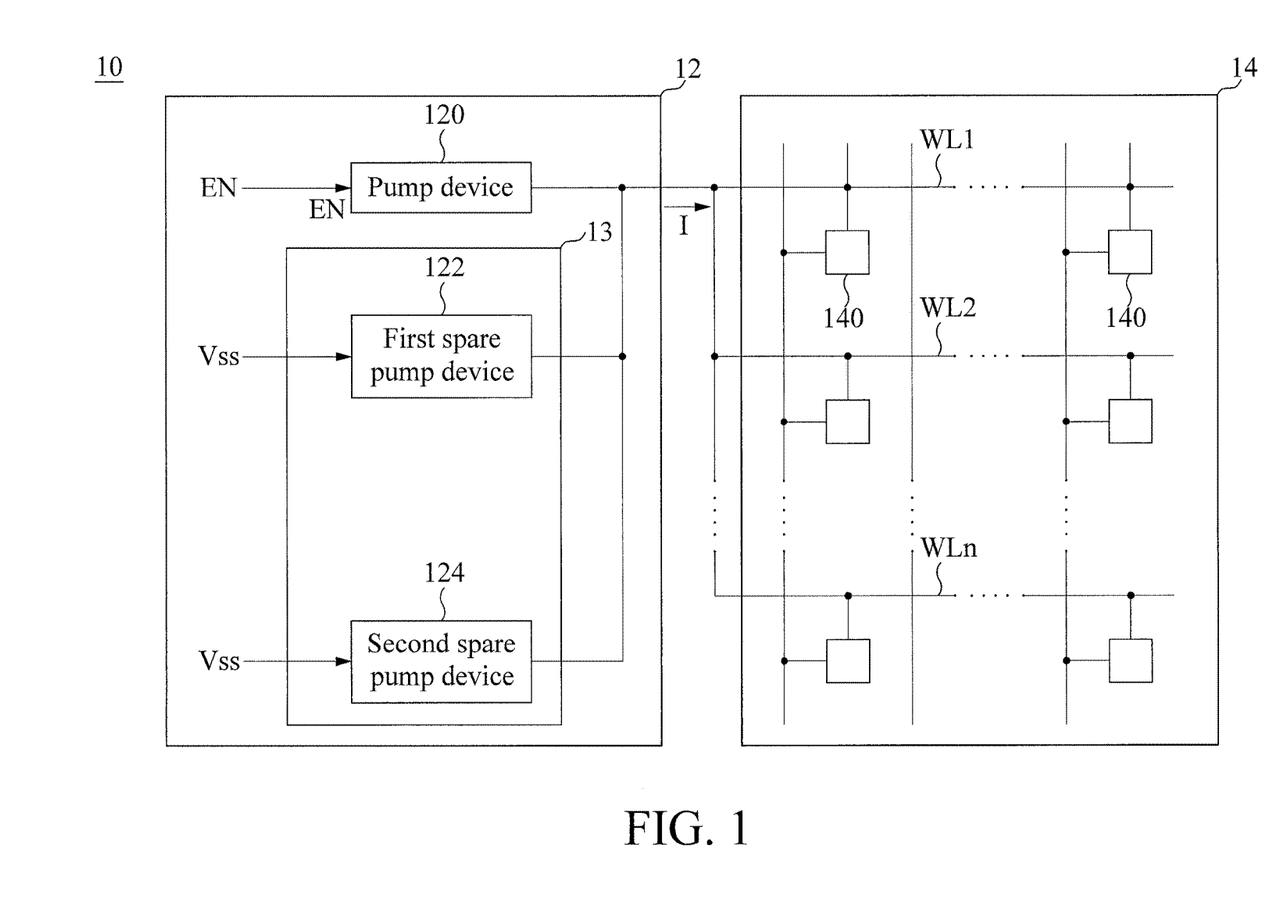
FIG. 1 is a schematic diagram of a comparative dynamic random access memory (DRAM) including a pump system.

FIG. 1 is a schematic diagram of a comparative dynamic random access memory (DRAM) 10 including a pump system 12. Referring to FIG. 1, in addition to pump system 12 including a pump device 120 and a spare pump assembly 13, DRAM 10 further includes a bank 14 including a plurality of word lines WL1 to WLn where n is a positive number greater than or equal to one, and a plurality of memory cells 140 which store data.

Pump device 120 is enabled in response to an enable signal EN, and provides a current I sufficient to allow bank 14 of DRAM 10 to operate at a normal refresh rate without needing other spare pump devices, for example, spare pump assembly 13. The normal refresh rate refers to a refresh rate described in a spec of a DRAM. Generally, most DRAM functions are tested at the normal refresh rate. That is, the normal refresh rate can be deemed as a standard refresh rate of the DRAM. Pump device 120, for clarity of discussion, is identified and illustrated as a single device. However, pump device 120 may alternatively represent an assembly including a plurality of pump devices 120.

Spare pump assembly 13 including a first spare pump device 122 and a second spare pump device 120 is designed to couple a reference ground voltage level Vss. As such, spare pump assembly 13 is kept disabled in response to reference ground voltage level Vss although spare pump assembly 13 has been arranged in pump system 12 already. As a result, spare pump assembly 13 is not able to provide any current to bank 14 in combination with pump device 120.

Spare pump assembly 12 as its name is a spare pump assembly. Function of the spare pump assembly is described in detail below. DRAM design flow includes a circuit design stage and a test stage. In the circuit design stage, a circuit structure of the DRAM is designed and prepared. In the circuit structure, a pump device is coupled to an enable signal (similar to that, pump device 120 is coupled to enable signal EN); and a spare pump assembly is not coupled to the enable signal (similar to that spare pump assembly 13 is not coupled to enable signal EN). A circuit simulation is performed on the circuit structure by using a simulation program with, for example, integrated circuit emphasis (SPICE), or other suitable programs. During the circuit simulation, parameters of components of the circuit structure may be adjusted. However, because of the circuit structure, the spare pump assembly is kept not coupled to the enable signal. The circuit simulation is repeatedly performed until the simulation result indicates that the current is ideally sufficient to allow a bank of the DRAM to operate at the normal refresh rate.

Afterwards, the design flow proceeds to the test stage. In the test stage, the DRAM is, based on the circuit structure, manufactured as a product. A product test on the product determines whether the current is actually sufficient to allow the bank to operate at the normal refresh rate. If the product test is negative (i.e., if the current is actually not sufficient), the circuit structure is redesigned and layout of the redesigned circuit structure is also redesigned by, for example, metal options. In the redesigned circuit structure, because of the redesigned circuit structure, one or more spare pump devices are coupled to the enable signal. Taking DRAM 10 of FIG. 1, for instance, in the redesigned circuit structure of DRAM 10, first spare pump device 122 and second spare pump device 124 are coupled to enable signal EN as pump device 120 did, instead of reference ground voltage level Vss.

After the one or more spare pump devices is coupled to the enable signal, the one or more spare pump devices are enabled to, in combination with the pump device, provide the current sufficient to allow the bank to operate at the normal refresh rate in response to the enable signal. That is, the spare pump assembly would otherwise provide, in combination with the pump device, a current sufficient to allow the bank to operate at a normal refresh rate only when the circuit structure of the DRAM is redesigned by, for example, metal option. Redesign of the circuit structure by metal option means that the circuit structure is not changed substantially except for an arrangement of metal layers associated with the spare pump assembly. The arrangement of the metal layers is changed such that the pump spare pump assembly is coupled to the enable signal via the changed arrangement.

However, if the product test is affirmative (i.e., the current provided only by the pump device without the spare pump assembly is actually sufficient to allow the bank to operate at the normal refresh rate), the circuit structure is confirmed and there is no need to redesign the circuit structure of the DRAM. In that case, the spare pump assembly (also the one or more spare pump devices) is arranged, but is not utilized. Taking DRAM 10 of FIG. 1, for instance, the spare pump assembly 13 is arranged, but is not utilized. As a result, DRAM 10 component usage is not efficient.

Moreover, a DRAM must be periodically refreshed, as the capacitors (not shown) of memory cells of the DRAM that store a charge in the DRAM may leak the charge over time. A refresh rate for, for example, a word line is associated with the magnitude of a current conducting the word line. Generally, to achieve the relatively high refresh rate, a relatively great magnitude of the current is required. However, pump system 12 is only able to provide one constant current. Because of being limited by the one constant current, bank 14 is only able to operate at the normal refresh rate. Application flexibility is relatively low.

Figure 2:
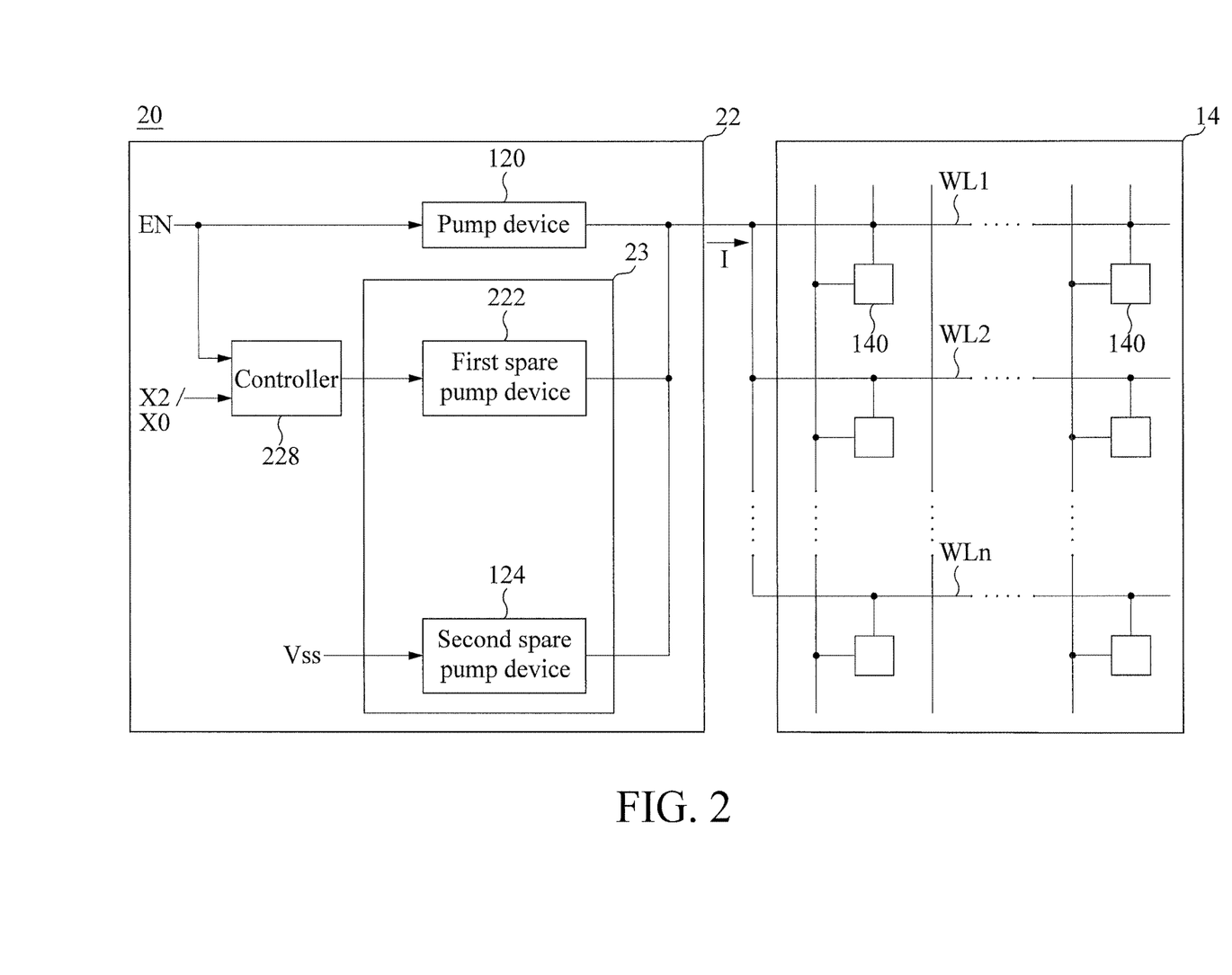
FIG. 2 is a schematic diagram of a DRAM which includes a pump system, in accordance with some embodiments of the present disclosure.

FIG. 2 is a schematic diagram of a DRAM 20 including a pump system 22, in accordance with some embodiments of the present disclosure. DRAM 20 is able to operate at two refresh rates, a normal refresh rate indicated by a normal instruction X0 and a first refresh rate, indicated by a first instruction X2, greater than the normal refresh rate, which will be described in detail below.

Referring to FIG. 2, pump system 22 is similar to pump system 12 described and illustrated with reference to FIG. 1 except that, for example, pump system 22 includes a controller 228 and a spare pump assembly 23 including a first spare pump device 222. First spare pump device 222 and second spare pump device 124 are independent of each other.

Controller 228 receives an enable signal EN, and either normal instruction X0 or first instruction X2. Controller 228 enables or disables first spare pump device 222 in response to the received instruction. In further detail, when controller 228 receives normal instruction X0, controller 228 disables first spare pump device 222 in response to normal instruction X0. Alternatively, when controller 228 receives first instruction X1, controller 228 enables first spare pump device 222 in response to first instruction X1.

First spare pump device 222 provides in combination with pump device 120 a current I sufficient to allow bank 14 to operate at the first refresh rate when first spare pump device 222 is enabled, and does not provide the current when disabled.

With a connection to controller 228, first spare pump device 222 is able to function although first spare pump device 222 is a spare pump device which would otherwise be able to perform functions only when the circuit structure of a DRAM which includes the spare pump device is redesigned, like first spare pump device 122 of FIG. 1. As a result, DRAM 20 component usage is efficient. Moreover, with controller 228, pump system 22 is able to provide different currents in response to different refresh rates. As a result, DRAM 20 application flexibility is relatively high.

Figure 3:
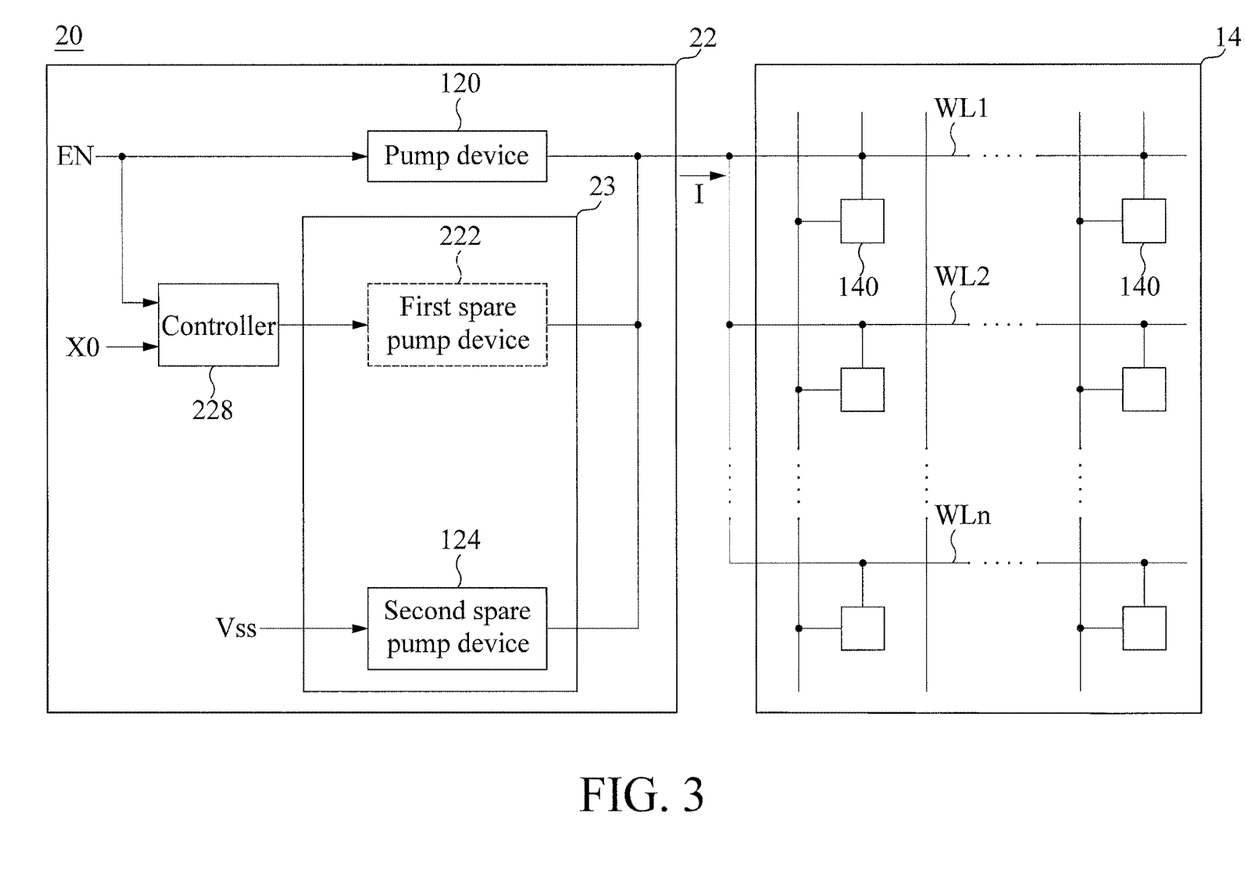
FIG. 3 is a schematic diagram illustrating an action of the DRAM shown in FIG. 2 operating at a normal refresh rate, in accordance with some embodiments of the present disclosure.

FIG. 3 is a schematic diagram illustrating an action of DRAM 20 shown in FIG. 2 operating at the normal refresh rate, in accordance with some embodiments of the present disclosure. Referring to FIG. 3, controller 228 receives enable signal EN and normal instruction X0. Controller 228 disables first spare pump device 222 by not passing enable signal EN to first spare pump device 222 in response to normal instruction X0. In that case, pump device 120 provides current I sufficient to allow bank 14 of DRAM 20 to operate at the normal refresh rate without needing other spare pump devices (i.e., first spare pump device 222) in response to normal instruction X0 which indicates that bank 14 is instructed to operate at the normal refresh rate.

Figure 4:
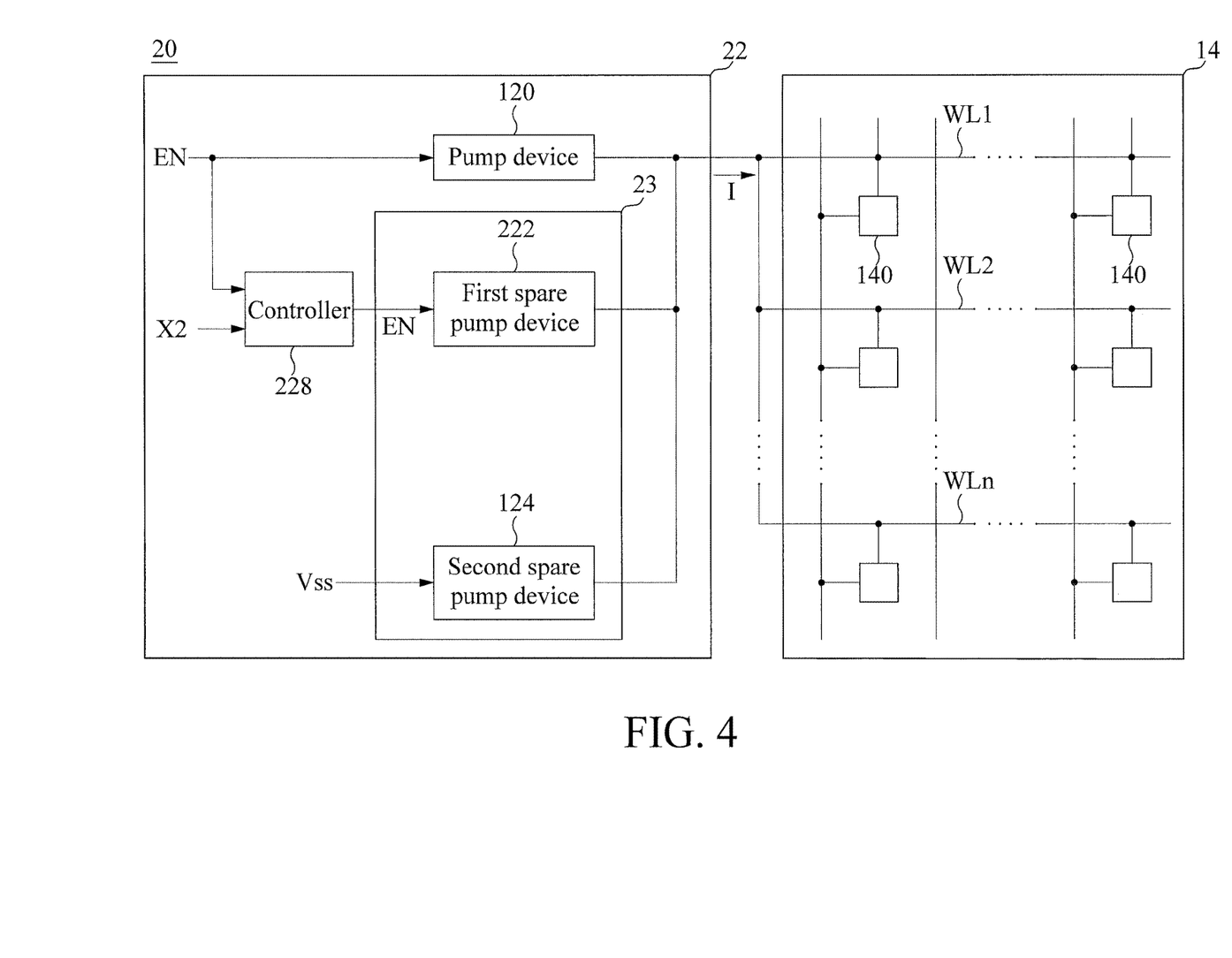
FIG. 4 is a schematic diagram illustrating another action of the DRAM shown in FIG. 2 operating at a first refresh rate, in accordance with some embodiments of the present disclosure.

FIG. 4 is a schematic diagram illustrating another action of DRAM 20 shown in FIG. 2, operating at the first refresh rate, in accordance with some embodiments of the present disclosure. Referring to FIG. 4, controller 228 receives enable signal EN and first instruction X2. Controller 228 enables first spare pump device 222 by passing enable signal EN to first spare pump device 222 in response to first instruction X2. In that case, first spare pump device 222 provides in combination with pump device 120 the current I sufficient to allow bank 14 to operate at the first refresh rate in response to first instruction X2 which indicates that bank 14 is instructed to operate at the first refresh rate. Second spare pump device 124 is kept disabled in any refresh rate which bank 14 is instructed to operate at because the circuit structure of DRAM 20 is not redesigned as previously discussed to regarding first spare pump device 122 of FIG. 1.

Figure 5:
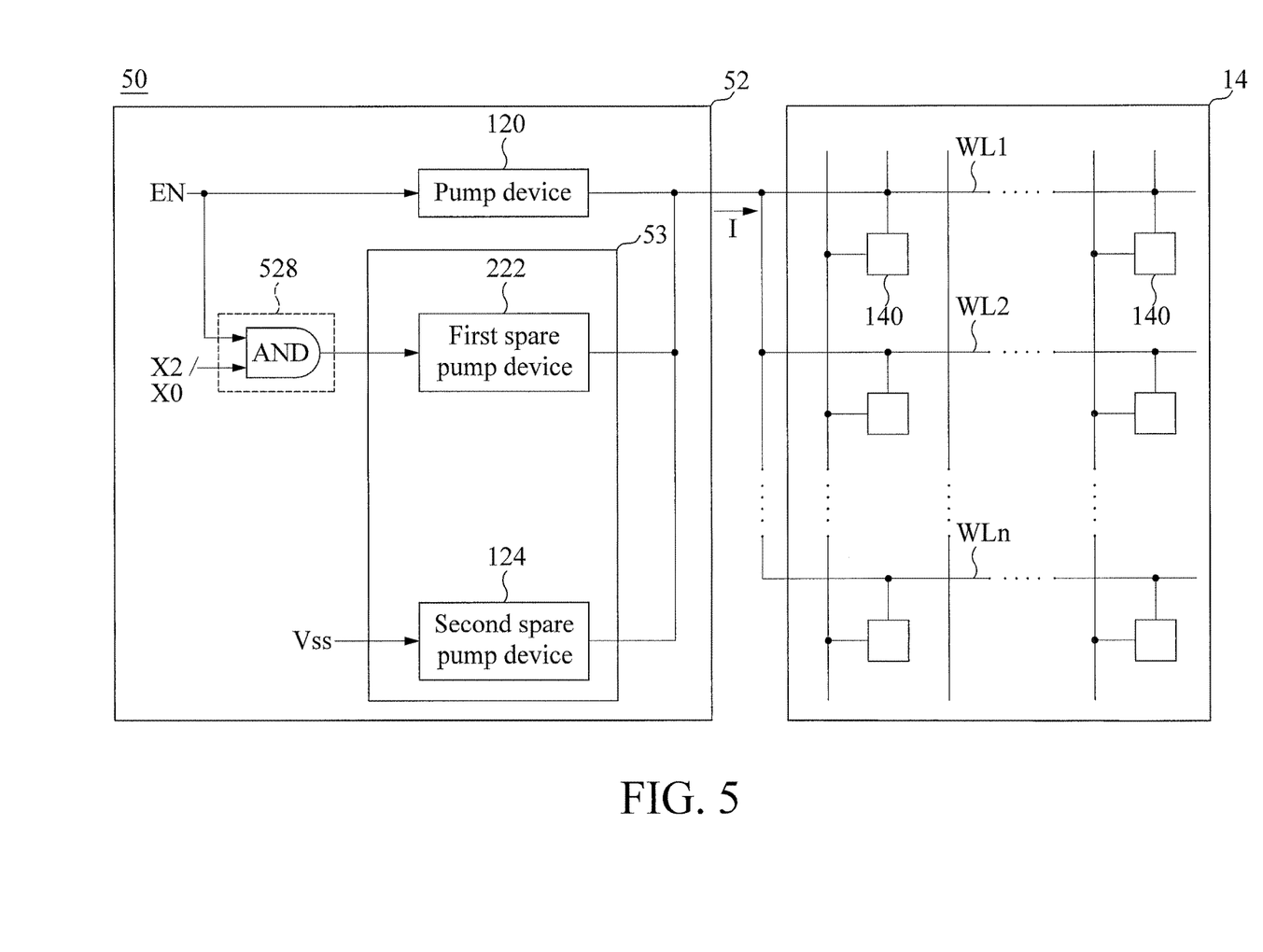
FIG. 5 is a schematic diagram of a DRAM including another pump system, in accordance with some embodiments of the present disclosure.

FIG. 5 is a schematic diagram of a DRAM 50 including another pump system 52, in accordance with some embodiments of the present disclosure. Referring to FIG. 5, pump system 52 is similar to pump system 22 described and illustrated with reference to FIG. 2 except that, for example, pump system 52 includes a controller 528 including a logic AND gate.

In an implementation, enable signal EN exhibits a logically high; normal instruction X0 exhibits a logically low; and first instruction X2 exhibits a logically high. When the logic AND gate receives the logically high of enable signal EN and the logically low of normal instruction X0, the logic AND gate passes the logically low to first spare pump device 222. In response to the logically low, first spare pump device 222 is disabled. Alternatively, when the logic AND gate receives the logically high of enable signal EN and the logically high of first instruction X2, the logic AND gate passes the logically high to first spare pump device 222. In response to the logically high, first spare pump device 222 is enabled.

With a connection to the logic AND gate, first spare pump device 222 is able to function although first spare pump device 222 is a spare pump device which would otherwise be able to perform functions only when the circuit structure of a DRAM including the spare pump device is redesigned, like first spare pump device 122 of FIG. 1. As a result, DRAM 50 component usage is efficient. Moreover, with the logic AND gate, pump system 52 is able to provide different currents in response to different refresh rates. As a result, DRAM 50 application flexibility is relatively high.

Figure 6:
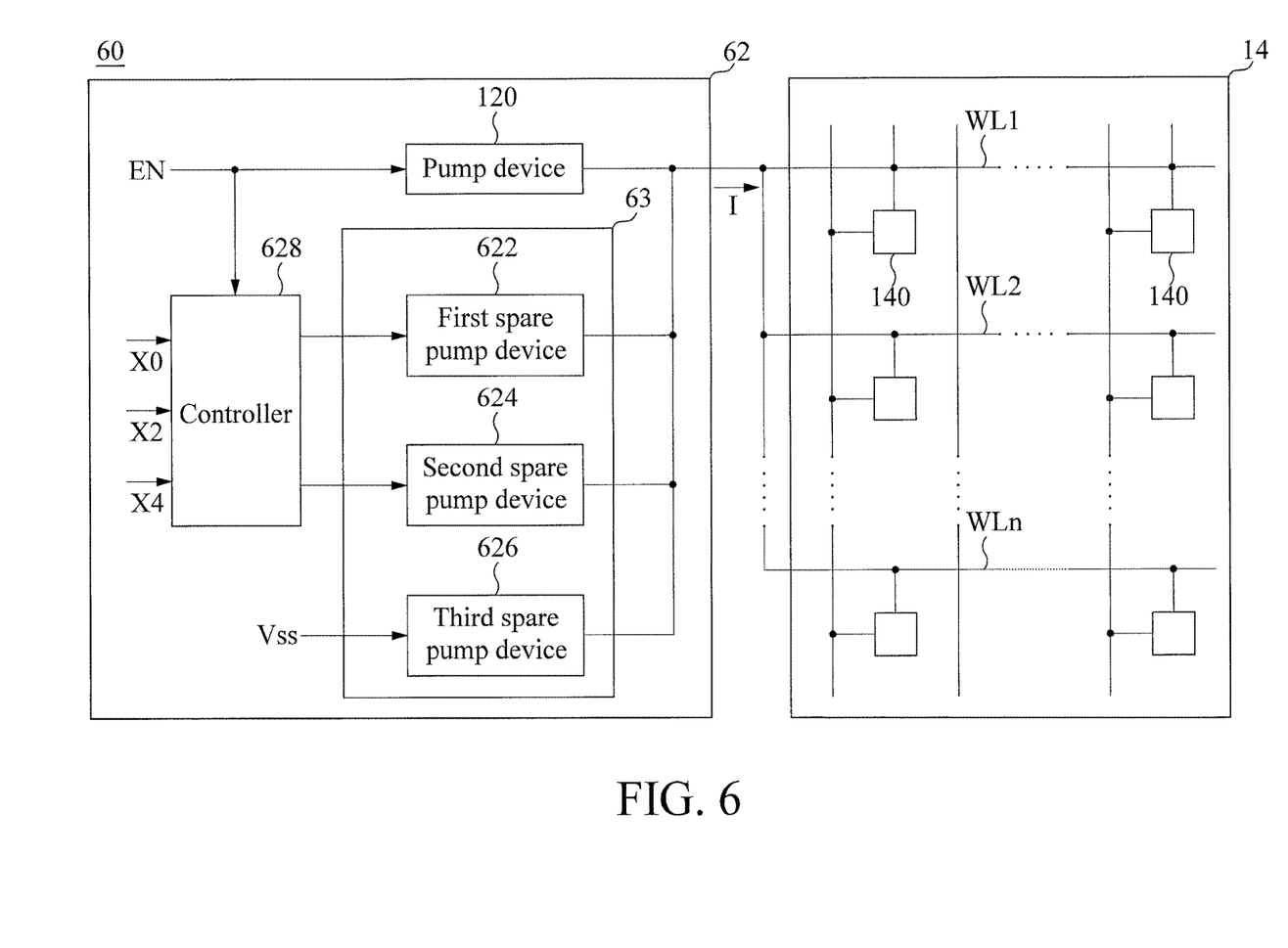
FIG. 6 is a schematic diagram of a DRAM including a pump system, in accordance with some embodiments of the present disclosure.

FIG. 6 is a schematic diagram of a DRAM 60 including a pump system 62, in accordance with some embodiments of the present disclosure. Referring to FIG. 6, pump system 62 is similar to pump system 22 described and illustrated with reference to FIG. 2 except that, pump system 62 includes a controller 628, and a spare pump assembly 63 including a first spare pump device 622, a second spare pump device 624 and a third spare pump device 626 independent of each other.

Controller 628, based on a refresh rate which bank 14 of DRAM 60 is instructed to operate at, either enables spare pump assembly 63, or disables spare pump assembly 63. In an embodiment, the refresh rate includes a normal refresh rate. In that case, controller 628 disables spare pump assembly 63. In another embodiment, the refresh rate includes a first refresh rate greater than the normal refresh rate. In that case, controller 628 enables spare pump assembly 63. In an embodiment, the first refresh rate is double the refresh rate of the normal refresh rate.

Moreover, when controller 628 enables spare pump assembly 63, controller 628, based on the refresh rate which bank 14 of DRAM 60 is instructed to operate at, determines the quantity of spare pump device sufficient to allow bank 14 to operate at the refresh rate. Additionally, controller 628, based on the determined quantity of spare pump device, enables one or more spare pump devices between first spare pump device 622 and second spare pump device 624 and disables the remaining spare pump devices.

For example, controller 628 determines that the quantity of spare pump device is one. In that case, controller 628 enables one of first spare pump device 622 and second spare pump device 624, and disables the other one of first spare pump device 622 and second spare pump device 624. For another example, controller determines that the quantity of spare pump device is two. In that case, controller 628 enables two spare pump devices, first spare pump device 622 and second spare pump device 624, and disables the remaining spare pump devices if the remaining spare pump devices are present.

Spare pump assembly 63 provides, in combination with pump device 120, current I sufficient to allow bank 14 to operate at the refresh rate when enabled, and does not provide the current when disabled. Further, the one or more enabled spare pump device in combination with pump device 120 provide the current I sufficient to allow bank 14 of DRAM 60 to operate at the refresh rate. However, third spare pump device 626 is kept disabled in any refresh rate which bank 14 is instructed to operate at. Function of third spare pump device 626 is the same as that of second spare pump device 124. When current I provided only by pump device 120 without spare pump assembly 63 is actually not sufficient to allow bank 14 to operate at the normal refresh rate, the circuit structure is redesigned and layout of the redesigned circuit structure is also redesigned by, for example, metal options. In the redesigned circuit structure, third spare pump device 626 is coupled to enable signal EN as pump device 120 did, instead of reference ground voltage level Vss.

With a connection to controller 628, first spare pump device 622 and second spare pump device 624 are able to function although first spare pump device 622 and second spare pump device 624 are a spare pump device which would otherwise be able to perform functions only when the circuit structure of a DRAM including the spare pump device is redesigned, like first spare pump device 122 of FIG. 1 and third pump device of FIG. 6. As a result, DRAM 60 component usage is efficient. Moreover, with controller 628, pump system 62 is able to provide different currents in response to different refresh rates. As a result, DRAM 60 application flexibility is relatively high.

Figure 7:
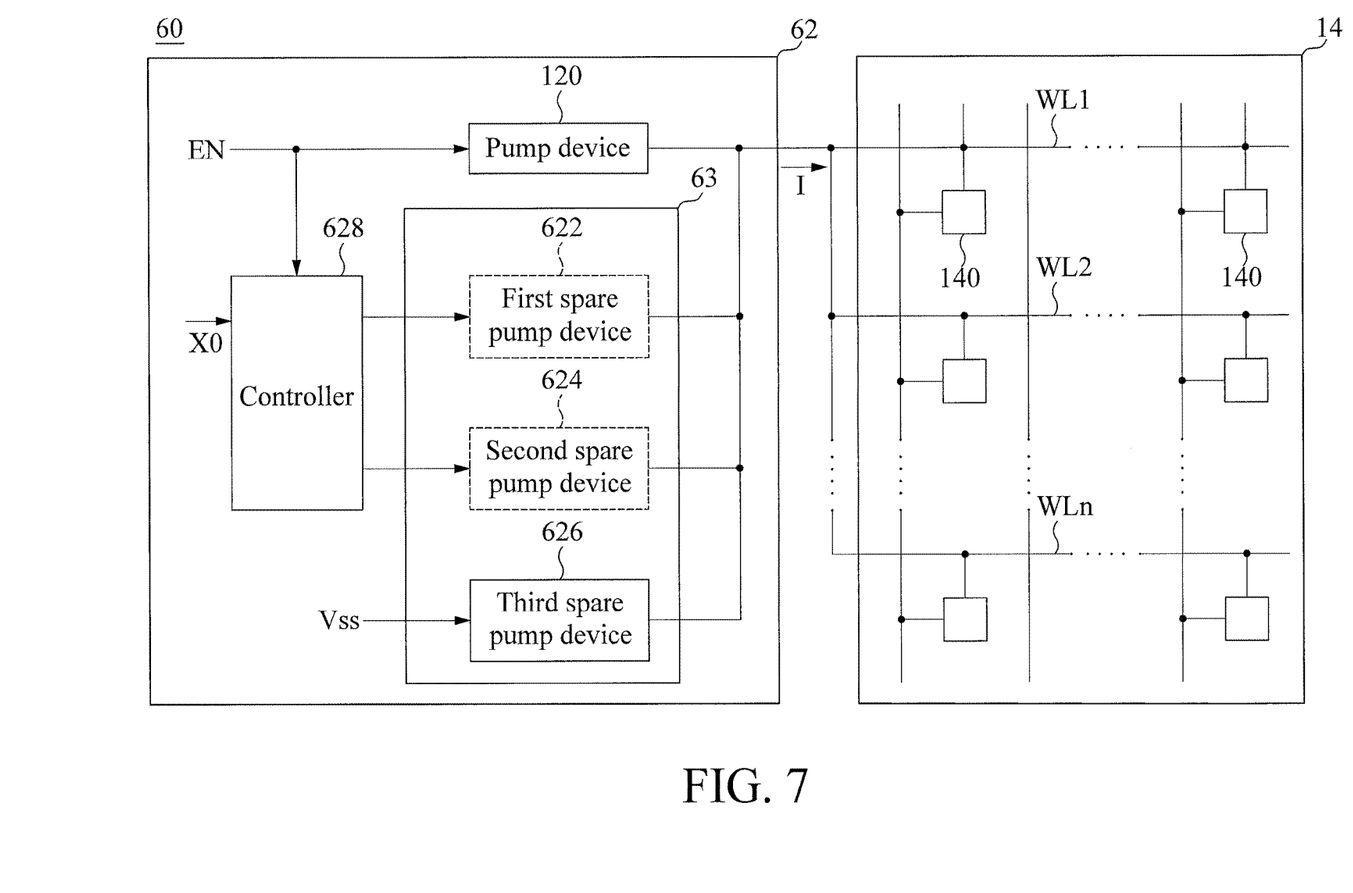
FIG. 7 is a schematic diagram illustrating an action the DRAM of FIG. 6 operating at a normal refresh rate, in accordance with some embodiments of the present disclosure.

FIG. 7 is a schematic diagram illustrating an action of the DRAM 60 of FIG. 6 operating at the normal refresh rate, in accordance with some embodiments of the present disclosure. Referring to FIG. 7, controller 628 receives enable signal EN and normal instruction X0. Controller 628 disables first spare pump device 622 and second spare pump device 624 by not passing enable signal EN to first spare pump device 622 and second spare pump device 624 in response to normal instruction X0. In that case, pump device 120 provides the current sufficient to allow bank 14 of DRAM 20 to operate at the normal refresh rate without the disabled spare pump assembly 63 in response to normal instruction X0 which indicates that bank 14 is instructed to operate at the normal refresh rate.

Figure 8:
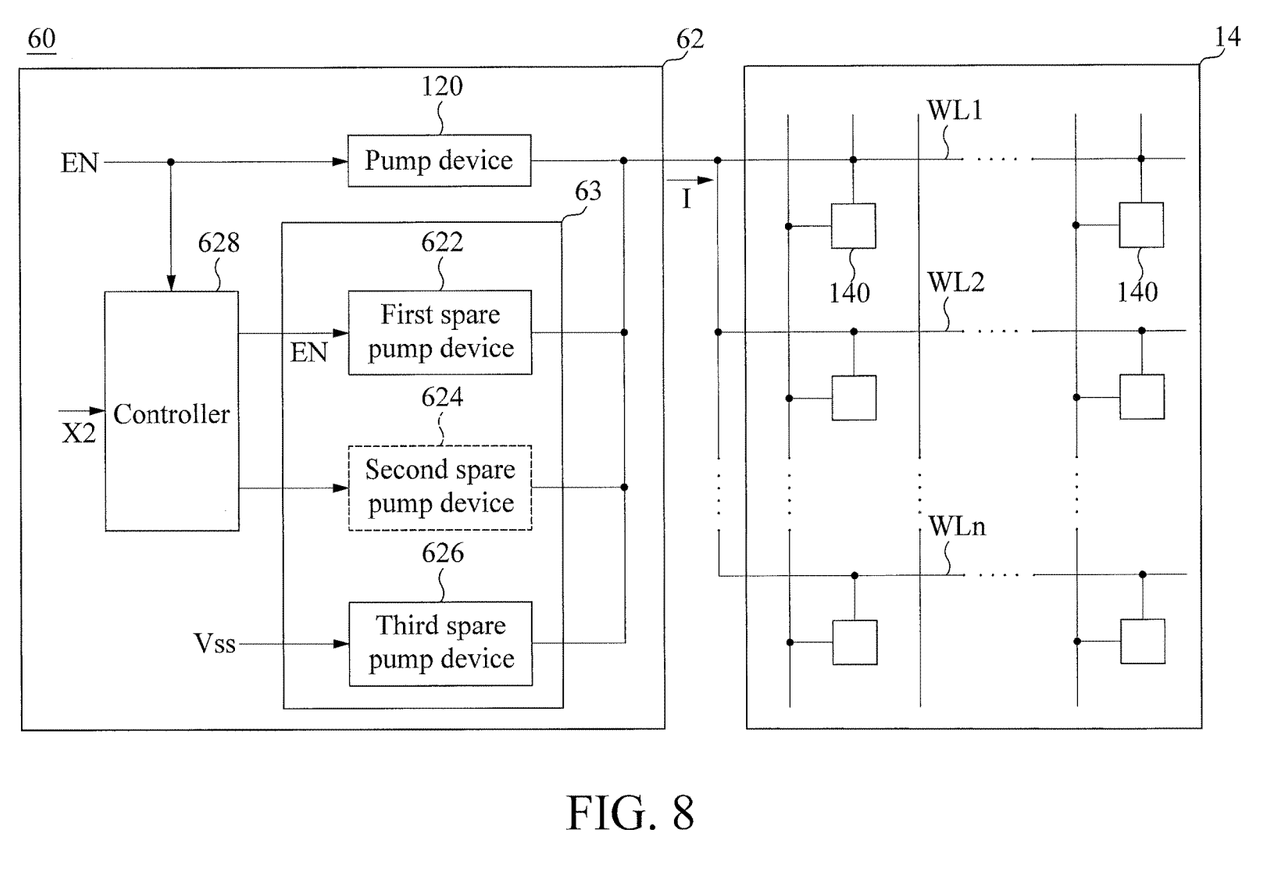
FIG. 8 is a schematic diagram illustrating another action of the DRAM of FIG. 6 operating in a first refresh rate, in accordance with some embodiments of the present disclosure.

FIG. 8 is a schematic diagram illustrating another action of the DRAM 60 of FIG. 6 operating in the first refresh rate, in accordance with some embodiments of the present disclosure. Referring to FIG. 8, controller 628 enables spare pump assembly 63. The enabled spare pump assembly 63 in combination with pump device 120 provides current I sufficient to allow bank 14 of DRAM 60 to operate at the first refresh rate. Moreover, controller 628 determines that the quantity of spare pump device is one based on the first refresh rate. In that case, controller 628 enables first spare pump device 622 in the present embodiment without enabling second spare pump device 624. In another embodiment, controller 628 enables second spare pump device 624 without enabling first spare pump device 622. Controller 628 enables first spare pump device 622 by passing enable signal EN to first spare pump device 622 in response to first instruction X2. In that case, first spare pump device 622 provides, in combination with pump device 120, current I sufficient to allow bank 14 to operate at the first refresh rate in response to first instruction X2 which indicates that bank 14 is instructed to operate at the first refresh rate.

Figure 9:
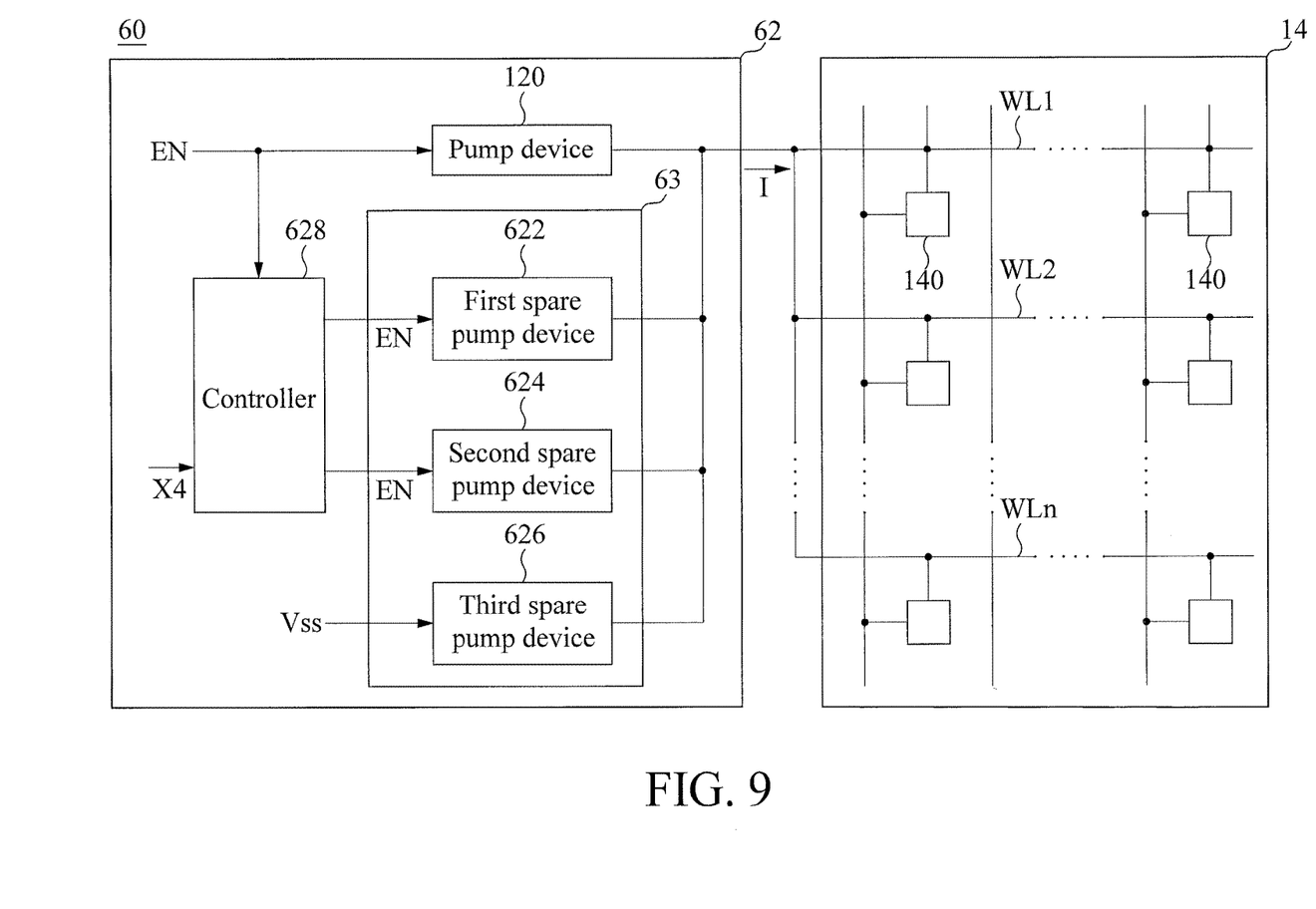
FIG. 9 is a schematic diagram illustrating further another action of the DRAM of FIG. 6 operating at a second refresh rate, in accordance with some embodiments of the present disclosure.

FIG. 9 is a schematic diagram illustrating further another action of the DRAM 60 of FIG. 6 operating at a second refresh rate greater than the first refresh rate, in accordance with some embodiments of the present disclosure. In an embodiment, the second refresh rate includes a quadruple refresh rate of the normal refresh rate. Referring to FIG. 9, controller 628 determines that the quantity of spare pump device is two. In that case, controller 628 enables both first spare pump device 622 and second spare pump device 624. Further, controller 628 enables first spare pump device 622 and second spare pump device 624 by passing enable signal EN to first spare pump device 622 and second spare pump device 624 in response to second instruction X4. In that case, first spare pump device 622 and second spare pump device 624 provide, in combination with pump device 120, current I sufficient to allow bank 14 to operate at the second refresh rate in response to second instruction X4 which indicates that bank 14 is instructed to operate at the second refresh rate.

Figure 10:
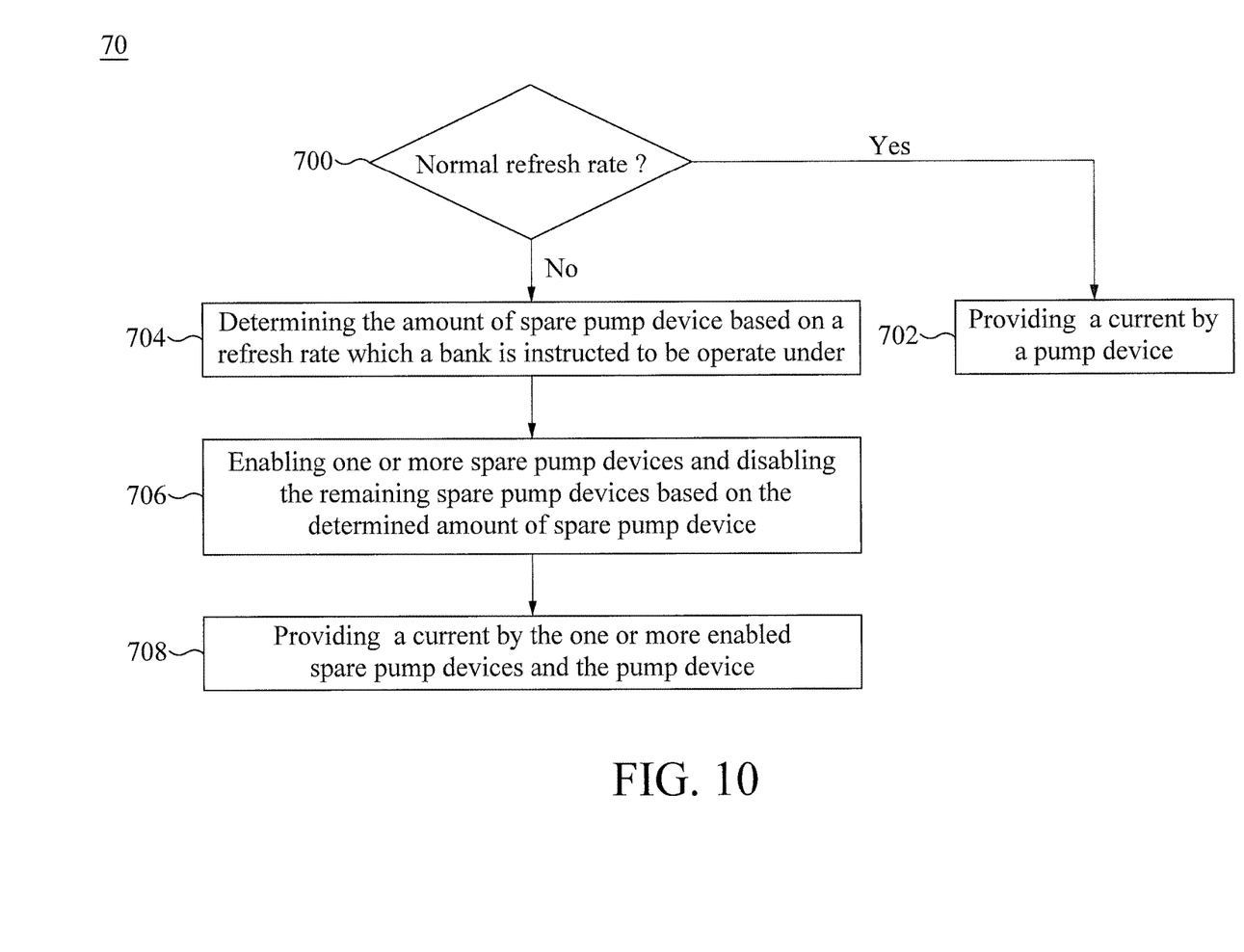
FIG. 10 is a flow diagram of a method for operating a pump system, in accordance with some embodiments of the present disclosure.

FIG. 10 is a flow diagram of a method 70 for operating a pump system, in accordance with some embodiments of the present disclosure. Referring to FIG. 10, method 70 includes operations 700, 702, 704, 706 and 708. The method 70 begins with operation 702, in which it is determined whether a DRAM is instructed to operate at a normal refresh rate based on a refresh rate indicated by an instruction. If affirmative, method 70 proceeds to operation 702, in which a pump device of the DRAM provides a current sufficient to allow a bank of the DRAM to operate at the normal refresh rate without needing any spare pump devices. In negative, method 70 proceeds to operation 704, in which the quantity of spare pump device is determined based on the refresh rate which the bank is instructed to be operate at. Subsequent to operation 704, method 70 proceeds to operation 706, in which one or more spare pump devices are enabled and the remaining spare pump devices are disabled based on the determined quantity of spare pump device. Method 70 continues with operation 708, in which a current sufficient to allow the bank to operate at the refresh rate is provided by the one or more enabled spare pump devices and the pump device.

In the present disclosure, with a connection to controller 628, first spare pump device 622 and second spare pump device 624 are able to function although first spare pump device 622 and second spare pump device 624 are a spare pump device which would otherwise be able to perform functions only when the circuit structure of a DRAM including the spare pump device is redesigned, like first spare pump device 122 of FIG. 1 and third pump device 626 of FIG. 6. As a result, DRAM 60 component usage is efficient. Moreover, with controller 628, pump system 62 is able to provide different currents in response to different refresh rates. As a result, DRAM 60 application flexibility is relatively high.

In contrast, in the comparative DRAM 10, when current I provided only by pump device 120 without spare pump assembly 13 is actually sufficient to allow bank 14 to operate at the normal refresh rate), the circuit structure of DRAM 10 is confirmed and there is no need to redesign the circuit structure of DRAM 10. In that case, spare pump assembly 13 is arranged but is not utilized. As a result, DRAM 10 component usage is not efficient. Moreover, DRAM 10 is not able to operate at different refresh rates. As a result, DRAM 10 application flexibility is relatively low.

One aspect of the present disclosure provides a pump system of a DRAM. The pump system includes a pump device and a spare pump assembly. The pump device provides a current sufficient to allow a bank of the DRAM to operate at a normal refresh rate without other spare pump devices in response to a normal instruction which indicates that the bank is instructed to operate at the normal refresh rate. The spare pump assembly, which would otherwise provide in combination with the pump device a current only when a circuit structure of the DRAM is redesigned by metal option, including a first spare pump device configured to provide in combination with the pump device a current sufficient to allow the bank to operate at a first refresh rate greater than the normal refresh rate in response to a first instruction which indicates that the bank is instructed to operate at the first refresh rate.

Another aspect of the present disclosure provides a pump system of a DRAM. The pump system includes a pump device, a spare pump assembly independent of the pump device and a controller. The controller configured to, based on a refresh rate which a bank of the DRAM is instructed to operate at, either enable the spare pump assembly, the enabled spare pump assembly in combination with the pump device providing a current sufficient to allow the bank of the DRAM to operate at the refresh rate, or disable the spare pump assembly, the pump device providing the current sufficient to allow the bank of the DRAM to operate at the refresh rate without the disabled spare pump assembly.

Another aspect of the present disclosure provides a method of operating a pump system of a DRAM. The method includes either enabling the spare pump assembly, or disabling the spare pump assembly based on a refresh rate which a bank of the DRAM is instructed to operate at; providing a current sufficient to allow the bank of the DRAM to operate at the refresh rate by the enabled spare pump assembly in combination with the pump device; and providing the current sufficient to allow the bank of the DRAM to operate at the refresh rate by the pump device without the disabled spare pump assembly.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A pump system of a DRAM, comprising:
   a pump device configured to provide a first current sufficient to allow a bank of the DRAM to operate at a normal refresh rate without other spare pump devices in response to a normal instruction which indicates that the bank is instructed to operate at the normal refresh rate;
   a spare pump assembly, coupled with the pump device in parallel, which would otherwise provide, in combination with the pump device, the first current sufficient to allow the bank of the DRAM to operate at the normal refresh rate only when a circuit structure of the DRAM is redesigned by metal option, wherein the spare pump assembly includes a first spare pump device configured to provide, in combination with the pump device, a second current sufficient to allow the bank to operate at a first refresh rate greater than the normal refresh rate in response to a first instruction which indicates that the bank is instructed to operate at the first refresh rate; and
   a controller configured to disable the first spare pump device in response to the normal instruction, and to enable the first spare pump device in response to the first instruction.

2. The pump system of claim 1, wherein the first refresh rate is double the refresh rate of the normal refresh rate.

3. The pump system of claim 1, wherein the controller is further configured to receive an enable signal, and disable the first spare pump device by not passing the enable signal to the first spare pump device.

4. The pump system of claim 3, wherein when the controller receives both the enable signal and the normal instruction, the controller disables the first spare pump device.

5. The pump system of claim 1, wherein the controller is further configured to receive an enable signal, and pass that signal to the first spare pump device.

6. The pump system of claim 5, wherein when the controller receives both the enable signal and the first instruction, the controller enables the first spare pump device.

7. The pump system of claim 1, wherein the spare pump assembly further includes:
   a second spare pump device configured to be kept disabled at any refresh rate which the bank is instructed to operate at, wherein both the first spare pump device and the second spare pump device are a spare pump device.

8. A pump system of a DRAM, comprising:
   a pump device;
   a spare pump assembly coupled with the pump device in parallel, wherein the spare pump assembly would otherwise provide, in combination with the pump device, a first current sufficient to allow a bank of the DRAM to operate at a normal refresh rate only when a circuit structure of the DRAM is redesigned by metal option; and
   a controller configured to, based on the normal refresh rate and a first refresh rate which the bank of the DRAM is instructed to operate at, enable the spare pump assembly, the enabled spare pump assembly in combination with the pump device providing a second current sufficient to allow the bank of the DRAM to operate at the first refresh rate greater than the normal refresh rate, and disable the spare pump assembly, the pump device providing the first current sufficient to allow the bank of the DRAM to operate at the normal refresh rate without the disabled spare pump assembly.

9. The pump system of claim 8, wherein the first refresh rate is double the refresh rate of the normal refresh rate.

10. The pump system of claim 8, wherein the spare pump assembly includes:
    a first spare pump device; and
    a second spare pump device;
    wherein when the controller is configured to enable the spare pump assembly, the controller is further configured to, based on the refresh rate which the bank of the DRAM is instructed to operate at, determine the quantity of spare pump device sufficient to allow the bank to operate at the refresh rate and, based on the determined quantity of spare pump device, to enable one or more spare pump devices between the first spare pump device and the second spare pump device and to disable the remaining spare pump devices,
    wherein the one or more enabled spare pump device in combination with the pump device provide the second current sufficient to allow the bank of the DRAM to operate at the refresh rate.

11. The pump system of claim 10, wherein when the refresh rate includes a first refresh rate, the controller enables the first spare pump device and disables the second spare pump device, and when the refresh rate includes a second refresh rate, the controller enables the first spare pump device and the second spare pump device.

12. The pump system of claim 8, wherein the controller is configured to disable the spare pump assembly in response to a normal instruction which indicates that the refresh rate includes a normal refresh rate, wherein the pump device is configured to provide the first current sufficient to allow the bank of the DRAM to operate at the normal refresh rate when the spare pump assembly is disabled.

13. The pump system of claim 12, wherein the controller is further configured to receive an enable signal, and disable the spare pump assembly by not passing the enable signal to the spare pump assembly.

14. The pump system of claim 13, wherein when the controller receives both the enable signal and the normal instruction, the controller disables the spare pump assembly.

15. The pump system of claim 8, wherein the controller is configured to enable the spare pump assembly in response to a first instruction which indicates that the refresh rate includes a first refresh rate greater than a normal refresh rate, wherein the pump device is configured to provide the first current sufficient to allow the bank of the DRAM to operate at the normal refresh rate when the spare pump assembly is disabled.

16. The pump system of claim 15, wherein the controller is further configured to receive an enable signal, and to enable the spare pump assembly by passing the enable signal to the spare pump assembly.

17. The pump system of claim 16, wherein when the controller receives both the enable signal and the first instruction, the controller enables the spare pump assembly.

18. The pump system of claim 10, wherein the spare pump assembly further includes:
a third spare pump device configured to be kept disabled in any refresh rate which the bank is instructed to operate at, wherein both the first spare pump device and the second spare pump device are a spare pump device.

19. A method of operating a pump system of a DRAM, the method comprising:
enabling a spare pump assembly, and disabling the spare pump assembly based on a refresh rate which a bank of the DRAM is instructed to operate at, wherein the spare pump assembly would otherwise provide, in combination with the pump device, a first current sufficient to allow a bank of the DRAM to operate at a refresh rate only when a circuit structure of the DRAM is redesigned by metal option;
providing the second current sufficient to allow the bank of the DRAM to operate at the refresh rate by the enabled spare pump assembly in combination with the pump device; and
providing the first current sufficient to allow the bank of the DRAM to operate at the refresh rate by the pump device without the disabled spare pump assembly.

20. The method of claim 19, wherein when the spare pump assembly is enabled, the method further includes:
determining the quantity of spare pump device sufficient to allow the bank to operate at the refresh rate based on the refresh rate which the bank of the DRAM is instructed to operate at;
enabling one or more spare pump devices between the first spare pump device and the second spare pump device based on the determined quantity of spare pump device;
disabling the remaining spare pump devices based on the determined quantity of spare pump device; and
providing the second current sufficient to allow the bank of the DRAM to operate at the refresh rate by the one or more enabled spare pump device in combination with the pump device.

* * * * *